(12) United States Patent
Murugan et al.

(10) Patent No.: US 7,680,226 B2
(45) Date of Patent: Mar. 16, 2010

(54) MINIMIZING DYNAMIC CROSSTALK-INDUCED JITTER TIMING SKEW

(75) Inventors: Rajen Murugan, Round Rock, TX (US); Girish K. Singh, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 1346 days.

(21) Appl. No.: 11/088,544

(22) Filed: Mar. 24, 2005

(65) Prior Publication Data

US 2006/0215792 A1 Sep. 28, 2006

(51) Int. Cl.
*H03D 1/04* (2006.01)
(52) U.S. Cl. .................. 375/346; 370/201; 379/392
(58) Field of Classification Search ............... 370/201, 370/503; 375/222, 343, 346, 355
See application file for complete search history.

(56) References Cited

U.S. PATENT DOCUMENTS

| | | | | |
|---|---|---|---|---|
| 4,715,064 | A * | 12/1987 | Claessen | 379/392 |
| 5,970,088 | A * | 10/1999 | Chen | 375/222 |
| 2005/0068985 | A1 * | 3/2005 | Li | 370/491 |
| 2005/0259692 | A1 * | 11/2005 | Zerbe | 370/503 |
| 2006/0034162 | A1 * | 2/2006 | Jones et al. | 370/201 |
| 2006/0227917 | A1 * | 10/2006 | Buchwald et al. | 375/355 |

OTHER PUBLICATIONS

Kamkar-Parsi et al (A Wideband Crosstalk Canceller for xDSL Using Common Mode Information, http://www.site.uottowa.ca/~bouchard/publis/transcomm04_dsl.pdf, pp. 1-9).*

Lam et al ( A Novel Dynamic Crosstalk Characterization Technique for 3-D Photonic Crossconnects, Photonics Technology Letters, IEEE vol. 15, Issue 1, Jan. 2003 pp. 141-143).*

Sen et al ("Signal-to-noise ratio as a predictor of speech transmission quality", IEEE Transactions on Audio and Electroacoustics, Publication Date: Aug. 1973, vol. 21, Issue: 4 on pp. 384-387).*

Rubenstein, Roy, *Copper Plays GBIT Part*, Electronics WEEKLY. COM, HTTP://WWW.ELECTRONICSWEEKLY.COM.ARTICLE16446.HTM, pp. 1-3.

Kamkar-Parsi, et al., *A Wideband Crosstalk Canceller for xDSL Using Common Mode Information*, HTTP://WWW.SITE.UOTTAWA.CA/~BOUCHARD/PUBLIS/TRANSCOMM04_DSL.PDF, pp. 1-9.

* cited by examiner

*Primary Examiner*—David C Payne
*Assistant Examiner*—Leon-Viet Q Nguyen
(74) *Attorney, Agent, or Firm*—Baker Botts L.L.P.

(57) ABSTRACT

A digital signal waveform receiving circuit may be processed by a non-linear adaptive canonical correlation analysis circuit that may quantify and minimize crosstalk-induced jitter timing skew for improving set-up and hold timing margins of data streams on the receiving circuit. A non-linear adaptive canonical correlation analysis circuit may be placed between an incoming digital signal from a serial link and a PHY receiving layer of an information handling system 100. The PHY receiving layer of the information handling system may be coupled to the non-linear adaptive canonical correlation analysis circuit or may be coupled to the digital signal. This coupling selection may be automatically programmed depending on received signal cross-talk-induced jitter timing skew or may be programmed by a user of the information handling system.

16 Claims, 3 Drawing Sheets

MINIMIZING DYNAMIC CROSSTALK-INDUCED JITTER TIMING SKEW

BACKGROUND OF THE INVENTION TECHNOLOGY

1. Field of the Invention

The present invention relates generally to information handling systems and, more particularly, to minimizing dynamic crosstalk-induced jitter timing skew in the information handling system.

2. Description of the Related Art

As the value and use of information continues to increase, individuals and businesses seek additional ways to process and store information. One option available to users are information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems, e.g., computer, personal computer workstation, portable computer, computer server, print server, network router, network hub, network switch, storage area network disk array, RAID disk system and telecommunications switch.

In the design of the information handling systems, data integrity at higher and higher clock rates is become more difficult to maintain because of crosstalk and other noise induced interference on the data signals of interest. Timing skew (TS), the uncertainty in the arrival of a signal edge, are typically influenced by the effects of crosstalk, simultaneous switching noise (SSN), data and clock jitter, and electromagnetic interference (EMI) among others. Crosstalk effects have a significant impact on the timing of digital circuits. This impact increases dramatically as designers migrate to smaller process technologies and faster clock frequencies. Crosstalk is localized electromagnetic interference (EMI), via capacitive and inductive coupling mechanisms, from one circuit that affects the signals in an adjacent circuit.

Generally, crosstalk coupling increases with increasing parallelism of signal conductors and clock/data edge rise rate. With the present transition to and adoption of the latest very high speed serial technology (e.g., PCI Express—"PCI-E," Serial Attached SCSI—"SAS," and fully buffered dual inline memory module (DIMM)—"FBD") to computer bus design, crosstalk-induced timing skew is becoming more challenging to quantify and minimize in the presence of other noise sources inherent in the information handling system.

The EWG (Electrical Working Group) for PCI-E GEN1 and GEN2, has recognized the contributions to the jitter budget in their recent investigation of the REFCLK and have made appropriate changes to the timing budget by taking away 30 picoseconds from the initial timing budget. As clock frequencies are increased and circuit densities decreased, crosstalk contribution to jitter can only become more pervasive.

No formalized analytical and/or empirical methodologies have been developed to address this crucial and recurrent limitation of appropriately identify and characterizing crosstalk-induced jitter timing skew, on-the-fly, as a crucial component that contributes significantly to the timing skew budget.

Referring to FIG. 1, a static-crosstalk approach may be used to compute far-end (FEXT) and near-end (NEXT) crosstalk noise based upon weak-coupling theory. This theory assumes that the coupling from the victim signal to the aggressor signal is insignificant. As such, to compute crosstalk, the victim (VICTIM-Q for Quiet Victim) signal is kept at either low or high states and the aggressor signals are excited. The amount of noise measured at the Far and Near ends of the victim circuit are the crosstalk noise contributions from the aggressors. This is the "static" approach to quantify crosstalk noise.

The problem with the "static" approach is that in a realistic situation, just as the aggressors inject noise onto the victim bus lines, so can the victim inject noise onto the aggressor bus lines. The real amount of noise seen on each bus line is the sum of the aggressors and "victim" (VICTIM-A for Aggressor victim). A realistic approach that addresses coupling from the VICTIM-A is called the strong-coupling (or dynamic) crosstalk method (see FIG. 2). Limitation in the use of the weak-coupling approach is very apparent for high speed signals with rise times in the sub 50 picoseconds range. It gives rise to unaccounted jitter timing skew due to the limitations inherent with the static approach.

SUMMARY

Therefore what is needed are information handling system data handling components, e.g., chipsets, having built-in provisions for adaptively quantifying and minimizing crosstalk dynamically. Specific example embodiments are presented herein that may provide a system, method and apparatus to quantify and minimize crosstalk-induced jitter timing skew so as to improve set-up and hold timing margins of a data stream on a high speed data bus and/or between digital devices of the information handling system by using a nonlinear canonical adaptive correlation analysis technique to minimize dynamic crosstalk noise from the "wanted" signal. This is unique with regard to existing approaches that used weak-coupling theory. By utilizing strong-coupling theory in specific embodiments, the present invention is far superior to what is presently being relied upon based on weak-coupling theory.

BRIEF DESCRIPTION OF THE DRAWINGS

A more complete understanding of the present disclosure and advantages thereof may be acquired by referring to the following description taken in conjunction with the accompanying drawings wherein.

Figure 1:
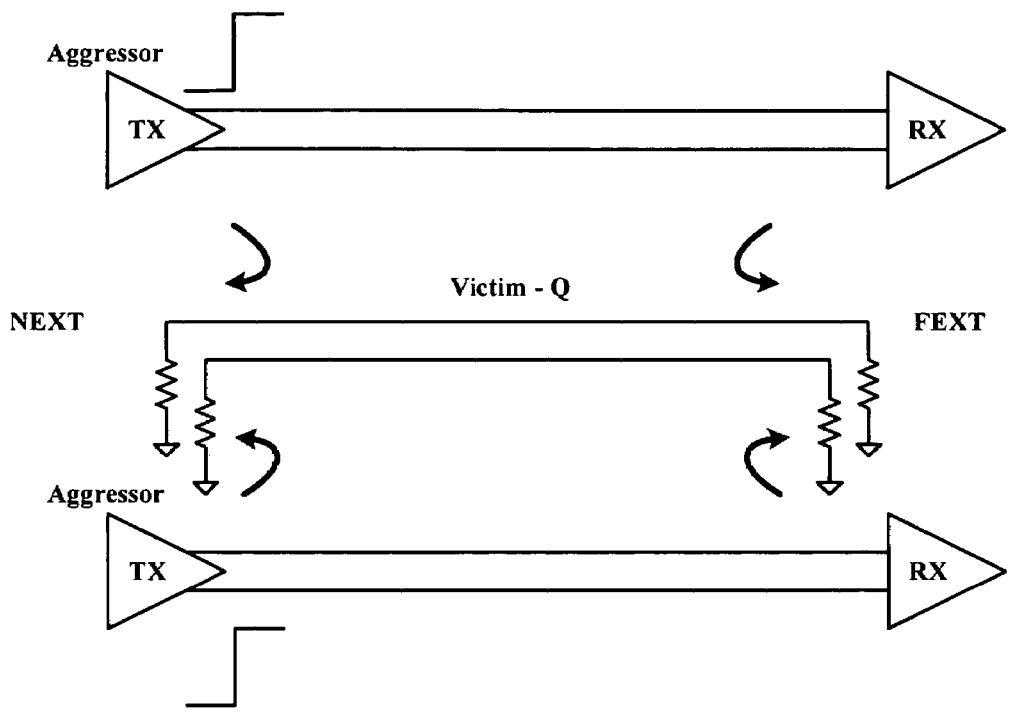
FIG. 1 is a schematic diagram of a weak coupling approach to quantify crosstalk noise contributions from noise inducing aggressors.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU), hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to the drawings, the details of specific example embodiments of the present invention are schematically illustrated. Like elements in the drawings will be represented by like numbers, and similar elements will be represented by like numbers with a different lower case letter suffix.

Figure 3:
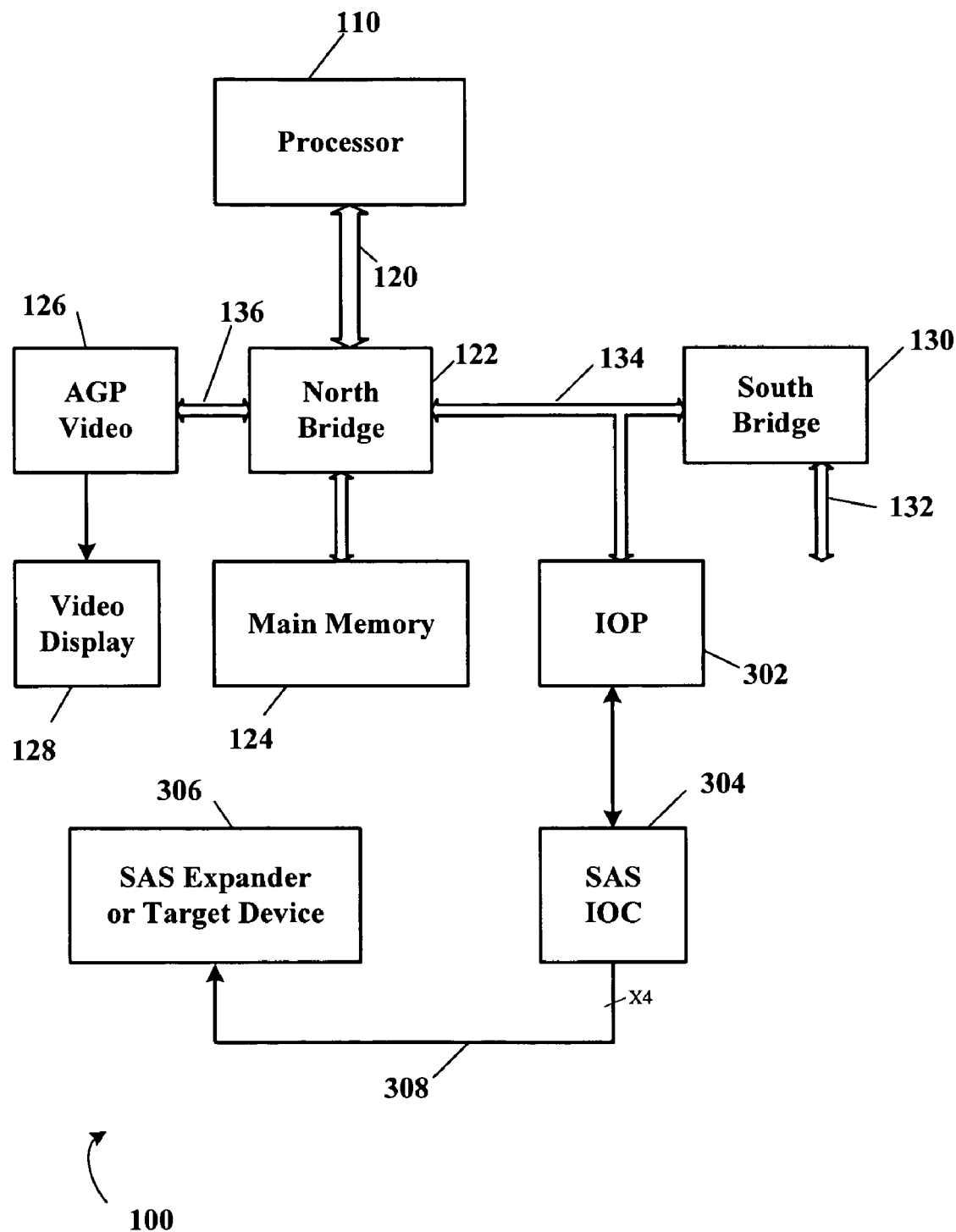
FIG. 3 is a schematic block diagram of an information handling system, according to a specific example embodiment of the present disclosure.

Referring to FIG. 3, depicted is an information handling system having electronic components mounted on at least one printed circuit board (PCB) (motherboard) and communicating data and control signals therebetween over signal buses. In one example embodiment, the information handling system is a computer system. The information handling system, generally referenced by the numeral 100, comprises at least one processor 110 coupled to a host bus(es) 120. A north bridge 122, which may also be referred to as a memory controller hub or a memory controller, is coupled to a main system memory 124. The north bridge 122 is coupled to the at least one system processor 110 via the host bus(es) 120. The north bridge 122 is generally considered an application specific chip set that provides connectivity to various buses, and integrates other system functions such as a memory interface. For example, an Intel 820E and/or 815E chip set, available from the Intel Corporation of Santa Clara, Calif., provides at least a portion of the north bridge 122. The chip set may also be packaged as an application specific integrated circuit (ASIC). The north bridge 122 typically includes functionality to couple the main system memory 124 to other devices within the information handling system 100. Thus, memory controller functions such as main memory control functions typically reside in the north bridge 122. In addition, the north bridge 122 provides bus control to handle transfers between the host bus 120 and a second bus(es), e.g., PCI bus 134, AGP bus 136 coupled to a video graphics interface 126 which drives a video display 128. A third bus(es) 132 may also comprise other industry standard buses or proprietary buses, e.g., ISA, SCSI, $I^2C$, SPI, USB buses through a south bridge(s) (bus interface) 130. An input-output processor (IOP) 302 of a SAS adapter is coupled to the north bridge 122. A SAS input-output controller (IOC) 304 is coupled to the IOP 302. The IOC 304 is adapted for coupling to an SAS expander or target device 306 through, for example, a plurality of SAS physical links 308.

Figure 4:
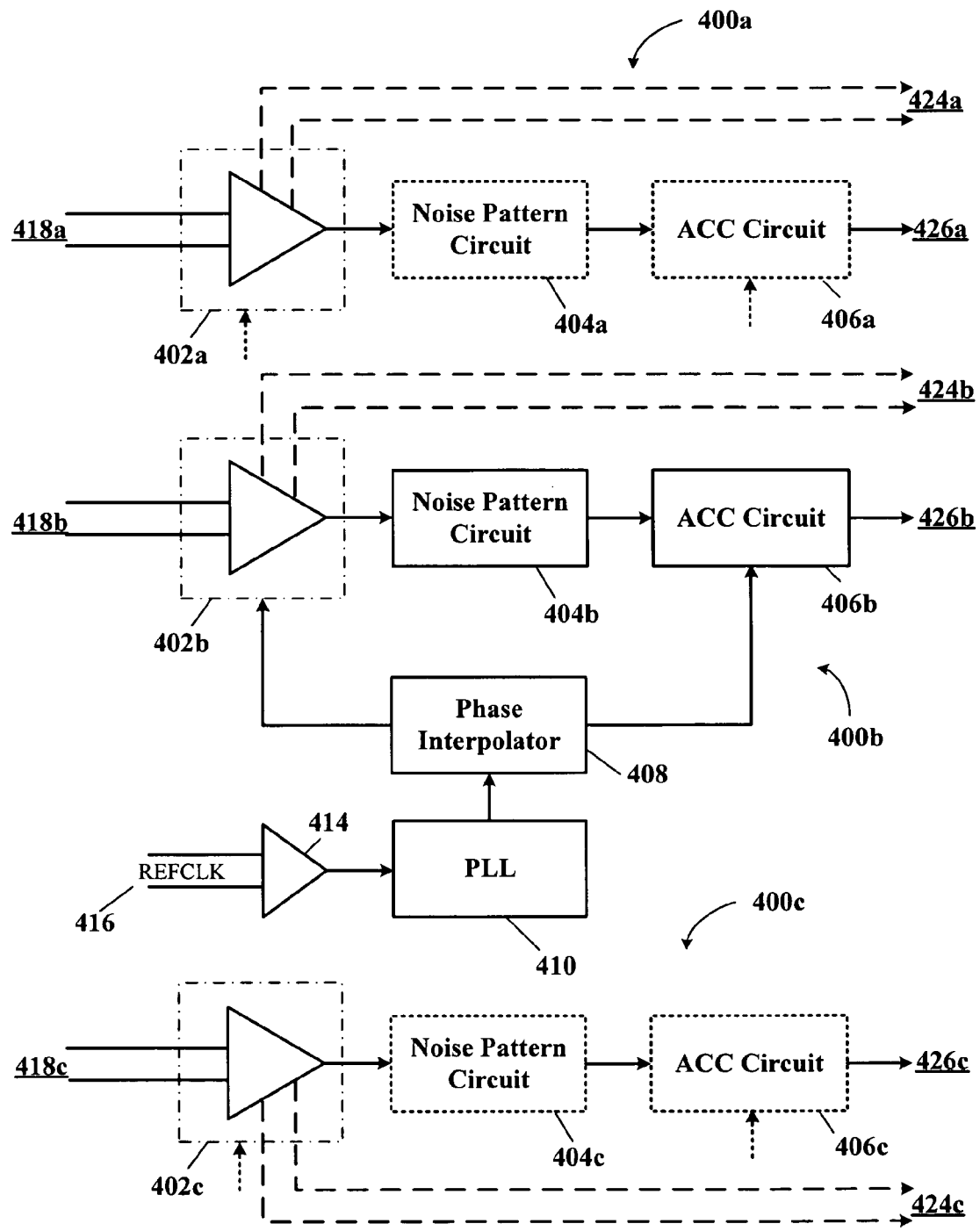
FIG. 4 is a schematic block diagram of a non-linear adaptive canonical correlation analysis circuit, according to a specific example embodiment of the present disclosure.

Referring to FIG. 4, depicted is schematic block diagram of a non-linear adaptive canonical correlation analysis circuit, according to a specific example embodiment of the present disclosure. A non-linear adaptive canonical correlation analysis circuit, generally represented by the numeral 400, for each digital input 418 may comprise a differential receiver 402, a noise pattern circuit 404, and an adaptive canonical correlation circuit 406. A phase interpolator 408, a phase-locked-loop (PLL) 410 and a reference clock buffer 414 may be coupled to each of the differential receivers 402 and adaptive canonical correlation circuits 406 (only one channel shown for illustrative clarity).

The non-linear adaptive canonical correlation analysis circuit 400 may be beneficially applied to digital signal receiving circuits that may have signal coupling therebetween that may generate near end cross talk (NEXT) and/or far end cross talk (FEXT). Each of the plurality of digital signal waveform receiving circuits may have a non-linear adaptive canonical correlation analysis circuit 400 to quantify and minimize crosstalk-induced jitter timing skew for improving set-up and hold timing margins of the data streams on each receiving circuit. A non-linear adaptive canonical correlation analysis circuit 400 may be placed between an incoming digital signal 418, from a serial link 308 (FIG. 3) and a PHY receiving layer (not shown) of the information handling system 100. The PHY receiving layer of the information handling system may be coupled to the non-linear adaptive canonical correlation analysis circuit 400 at an output 426 or may be coupled to the digital signal 418 at an output 424 (differential output shown). Selection of coupling either output 424 or output 426 to the PHY receiving layer may be automatically programmed depending on received signal error conditions or may be programmed by a user of the information handling system 100.

A system clock (REFCLK) 216, e.g., 100 MHz, may be from the information handling system 100, may be received by the differential input clock buffer amplifier 414, and may be applied to the phase-locked-loop (PLL) 410. The PLL 410 may be used as a coherent frequency multiplier for generating a very high frequency clock, e.g., 1.25 GHz. The very high frequency clock from the PLL 410 may be applied to the phase interpolator 408. The phase interpolator 408 may generate a plurality of phase shifted and phase coherent clock signals based upon the output of the PLL 410. These plurality of phase shifted and phase coherent clock signals may be applied to the differential input receivers 402 and the adaptive canonical correlation circuits 406. The clock signal to the differential input receiver 402 may be used in detecting the data signals 418 from the serial link 308 and may also be used in the operation of the adaptive canonical correlation circuits 406.

Figure 2:
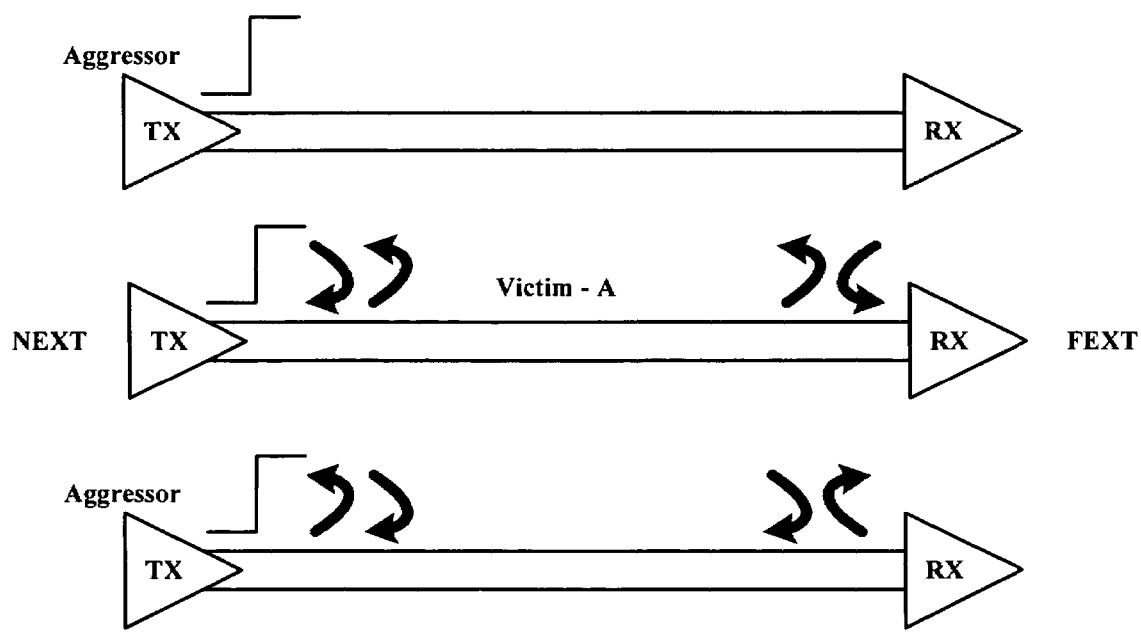
FIG. 2 is a schematic diagram of a strong coupling approach to quantify crosstalk noise contributions from noise inducing aggressors.

A worst crosstalk pattern may be employed during initialization of the non-linear adaptive canonical correlation analysis circuit 400 to compute "static" crosstalk. The time-domain profile of the crosstalk noise waveform, e.g., as measured on the VICTIM-A (see FIG. 1) may be generated. This pattern may then be used as a training pattern to extract the noise from the signal measured at the VICTIM-A RX (FIG. 2) using the technique of adaptive canonical correlation with Bayesian statistics. This technique may be used to detect certain features (in this case the dynamic crosstalk noise) and to be invariant to other features (e.g., the "desired" signal). This approach is adaptive to process, voltage and temperature (PVT) variations. A simulation of the present invention in minimizing jitter timing skew was compared to the aforementioned static crosstalk approach by using Matlab and displaying the results using CosmoScope. The results appear to indicate that the dynamic approach is more efficient in minimizing crosstalk-induced timing skew. The strong-coupling approach via adaptive canonical correlation indicates an improvement of about 24.8% over the existing static approach. This is approximately equal to 36.2 picoseconds improvement in the timing budget.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An information handling system having a non-linear adaptive canonical correlation analysis circuit for minimizing dynamic crosstalk-induced jitter timing skew of a serial data link, said system comprising:
   a non-linear adaptive canonical correlation analysis circuit coupled to a serial data link, wherein the non-linear adaptive canonical correlation analysis circuit comprises:
      a serial data receiver having an output, and an input coupled to the serial data link;
      a noise pattern circuit having an input coupled to the output of the serial data receiver; and
      an adaptive canonical correlation circuit having an input coupled to an output of the noise pattern circuit;
   a phase-locked-loop (PLL) coupled to an output of the clock buffer wherein the PLL coherently multiplies a frequency of the system clock;
   wherein the non-linear adaptive canonical correlation analysis circuit quantifies and minimizes crosstalk-induced jitter timing skew of the serial data link, based at least in part on noise from the serial data link and from one or more external noise sources; and
   wherein outputs of the phase interpolator are coupled to the serial data receiver and the adaptive canonical correlation circuit.

2. The information handling system according to claim 1, wherein an output of the adaptive canonical correlation circuit is coupled to a PHY layer.

3. The information handling system according to claim 1, wherein the serial data receiver input is a differential input.

4. The information handling system according to claim 1, further comprising a clock buffer coupled to a system clock.

5. The information handling system according to claim 4, further comprising a phase interpolator coupled to an output of the PLL, wherein the phase interpolator generates a plurality of phase coherent clock signals.

6. An information handling system having a non-linear adaptive canonical correlation analysis circuit for minimizing dynamic crosstalk-induced jitter timing skew of a serial data link, said system comprising:
   a non-linear adaptive canonical correlation analysis circuit coupled to a serial data link, wherein the non-linear adaptive canonical correlation analysis circuit comprises:
      a serial data receiver having an output, and an input coupled to the serial data link;
      a noise pattern circuit having an input coupled to the output of the serial data receiver; and
      an adaptive canonical correlation circuit having an input coupled to an output of the noise pattern circuit;
   wherein the non-Linear adaptive canonical correlation analysis circuit quantifies and minimizes crosstalk-induced jitter timing skew of the serial data link, based at least in part on noise from the serial data link and from one or more external noise sources;
   wherein a PHY layer is selectably coupled to either an output of the adaptive canonical correlation circuit or the output of the serial data receiver; and
   wherein the selectable coupling is programmable.

7. The information handling system according to claim 6, wherein the selectable coupling is programmed by a user.

8. The information handling system according to claim 6, wherein the selectable coupling is automatically determined by an amount of cross talk on the serial data link.

9. The information handling system according to claim 8, wherein the cross talk on the serial data link is near end cross talk.

10. The information handling system according to claim 8, wherein the cross talk on the serial data link is far end cross talk.

11. The information handling system according to claim 8, wherein the cross talk on the serial data link is a combination of near end cross talk and far end cross talk.

12. The information handling system according to claim 1, wherein a PHY layer is coupled to the output of the adaptive canonical correlation circuit when there is near end cross talk on the serial data link.

13. The information handling system according to claim 1, wherein a PHY layer is coupled to the output of the adaptive canonical correlation circuit when there is far end cross talk on the serial data link.

14. The information handling system according to claim 1, further comprising a plurality of serial data links, each of the plurality of serial data links having corresponding ones of the serial data receiver, the noise pattern circuit and the adaptive canonical correlation circuit.

15. The information handling system according to claim 14, wherein each of the corresponding adaptive canonical correlation circuit outputs is coupled to a corresponding PHY layer.

16. A method for minimizing dynamic crosstalk-induced jitter timing skew of a serial data link with a non-linear adaptive canonical correlation analysis, said method comprising the steps of:
   receiving a data stream from a serial data link;
   determining a worst crosstalk pattern for computing a static crosstalk;
   measuring a time-domain profile of a crosstalk noise waveform from the worst crosstalk pattern;
   creating a training pattern from the time-domain profile of the crosstalk noise waveform; and extracting dynamic crosstalk noise from the data stream using adaptive canonical correlation with Bayesian statistics;

wherein the dynamic crosstalk noise is detected during extraction thereof; and wherein information on the data stream is not affected when performing the step of extracting the dynamic crosstalk noise from the data stream.

* * * * *